(12) United States Patent
Perez Santafe et al.

(10) Patent No.: US 12,069,844 B2
(45) Date of Patent: Aug. 20, 2024

(54) DEVICE AND METHOD FOR NEUTRALIZING THE TRANSMISSION OF ELECTROMAGNETIC WAVES BY SHIELDING, BY MEANS OF A CONTAINER FOR THE HOLDING OF ELECTRICAL OR ELECTRONIC DEVICES WHICH ELECTROMAGNETICALLY PROTECTS THE SAME AND RENDERS THEM ELECTROMAGNETICALLY UNDETECTABLE

(71) Applicant: Jesus Perez Santafe, Saragossa (ES)

(72) Inventors: Jesus Perez Santafe, Saragossa (ES); Francisco Perez Santafe, Saragossa (ES)

( * ) Notice: Subject to any disclaimer, the term of this patent is extended or adjusted under 35 U.S.C. 154(b) by 0 days.

(21) Appl. No.: 17/779,102

(22) PCT Filed: Nov. 4, 2020

(86) PCT No.: PCT/ES2020/070675
§ 371 (c)(1),
(2) Date: May 23, 2022

(87) PCT Pub. No.: WO2021/105532
PCT Pub. Date: Jun. 3, 2021

(65) Prior Publication Data
US 2022/0418172 A1    Dec. 29, 2022

(30) Foreign Application Priority Data
Nov. 25, 2019  (ES) ................................ ES201930967

(51) Int. Cl.
*H05K 9/00*  (2006.01)

(52) U.S. Cl.
CPC .......... *H05K 9/0009* (2013.01); *H05K 9/0084* (2013.01); *H05K 9/0094* (2013.01)

(58) Field of Classification Search
CPC .................................................. H05K 9/0094
See application file for complete search history.

(56) References Cited

U.S. PATENT DOCUMENTS 6,855,883 B1    2/2005  Matsui
10,939,595 B1*  3/2021  Abouhatsira ........ H05K 9/0001
(Continued)

FOREIGN PATENT DOCUMENTS

CN    103179849 B    6/2016

*Primary Examiner* — Hung V Ngo
(74) *Attorney, Agent, or Firm* — Patwrite Law; Mark David Torche

(57) ABSTRACT

The device consists of a container manufactured from a metamaterial with the property of transparency to visible light, for the holding of electrical or electronic devices, which electromagnetically protects the same and renders them electromagnetically undetectable. The purpose of the device is to guarantee user confidentiality in the use of the electromagnetic waves associated with telecommunications, by means of the use of a type of container that encloses any type of telecommunication device or appliance, with the potentiality that the insertion thereof into said container prevents the detection by means of electromagnetic waves of said appliance, and therefore makes impossible the tracing of said appliance by electromagnetic remote sensing means, including mobile telephony, radiofrequencies, or satellite telecommunication means such as GPS, Galileo, or other systems, without it being necessary to switch off said appliance beforehand.

2 Claims, 4 Drawing Sheets

(56) References Cited

U.S. PATENT DOCUMENTS

| | | | |
|---|---|---|---|
| 2005/0118366 A1* | 6/2005 | Piemonte | H05K 9/009 428/34.1 |
| 2007/0142103 A1* | 6/2007 | Livne | G06F 1/1628 206/719 |
| 2012/0228020 A1* | 9/2012 | Winch | H05K 9/0043 174/378 |
| 2013/0277101 A1* | 10/2013 | Judy | H05K 9/0043 174/378 |
| 2013/0334472 A1* | 12/2013 | Avouris | B82Y 30/00 977/734 |
| 2014/0177196 A1* | 6/2014 | Kumar | H05K 9/0052 361/816 |
| 2014/0190841 A1* | 7/2014 | Nash | H05K 9/0045 206/37 |
| 2015/0201327 A1 | 7/2015 | McMahon | |
| 2015/0259546 A1* | 9/2015 | Kagawa | H04B 1/525 427/385.5 |
| 2015/0289421 A1* | 10/2015 | Ho | H05K 9/0094 361/679.02 |
| 2016/0197632 A1* | 7/2016 | Ha | H04B 1/3888 455/575.5 |
| 2016/0212893 A1 | 7/2016 | Byler | |
| 2018/0248579 A1* | 8/2018 | Hwang | H04B 1/3838 |
| 2019/0036564 A1* | 1/2019 | Tanenbaum | H04B 1/3838 |

* cited by examiner

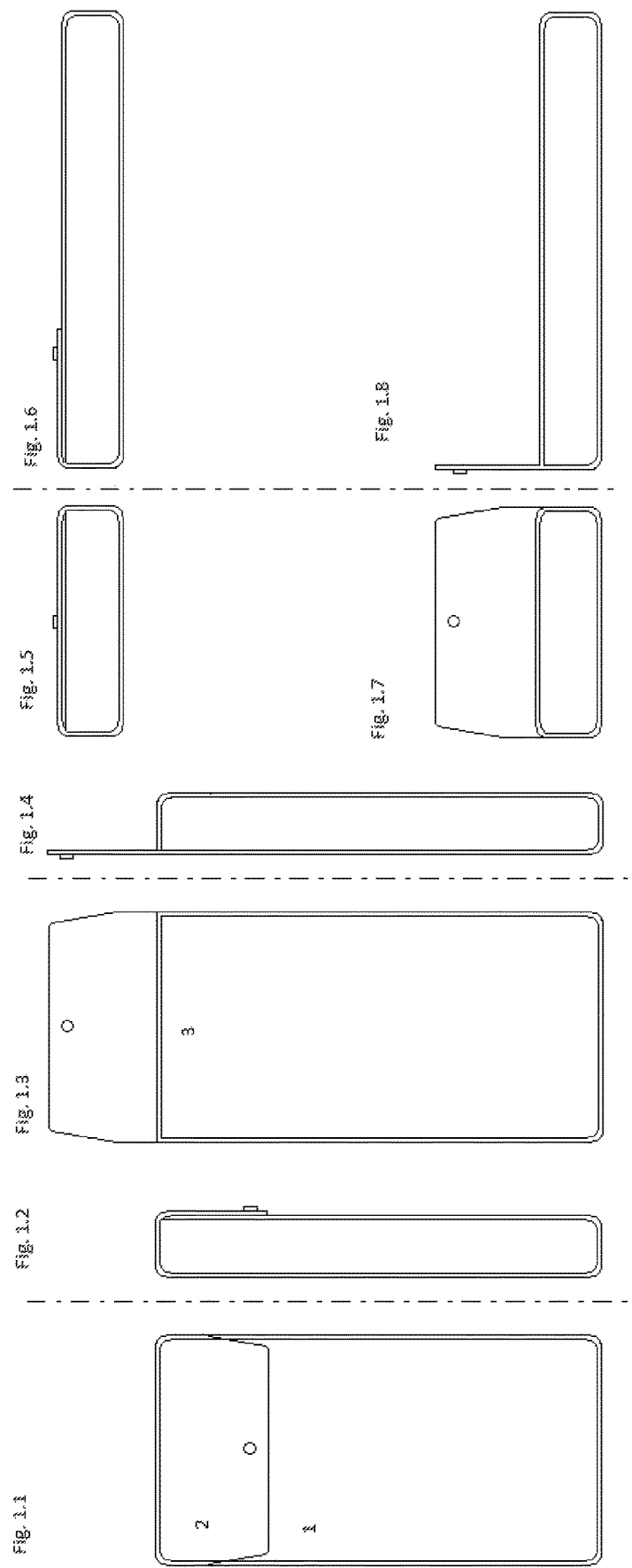

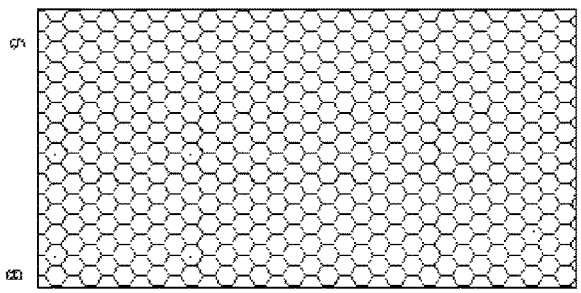
Fig. 2.2
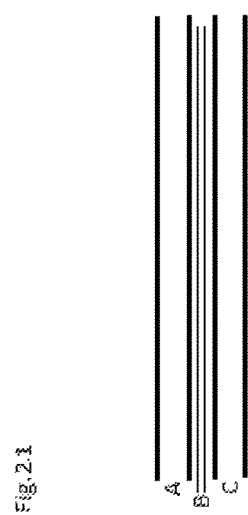
Fig. 2.1

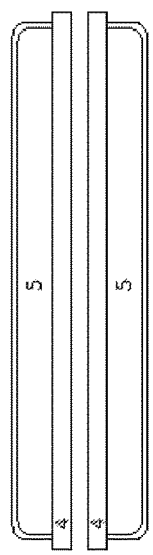
Fig. 3.3
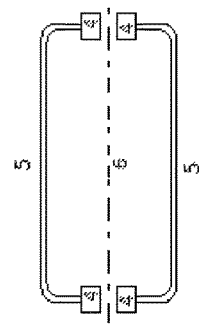
Fig. 3.2
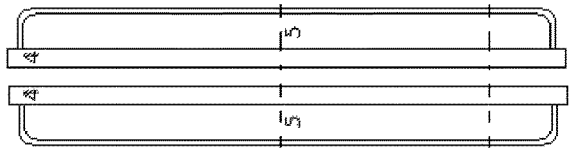
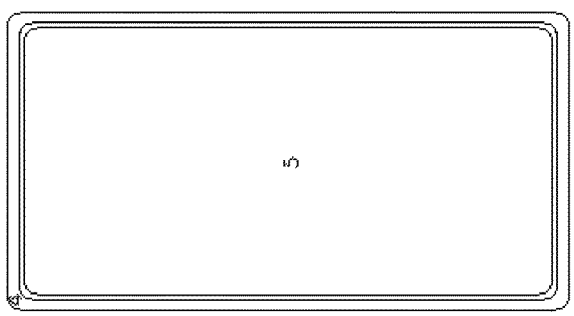
Fig. 3.1

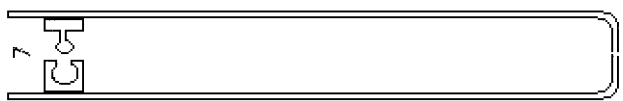
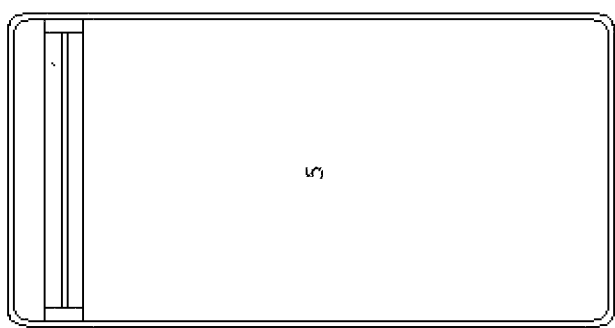
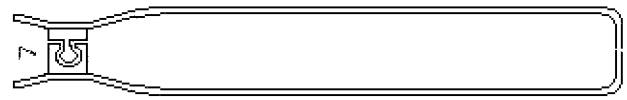
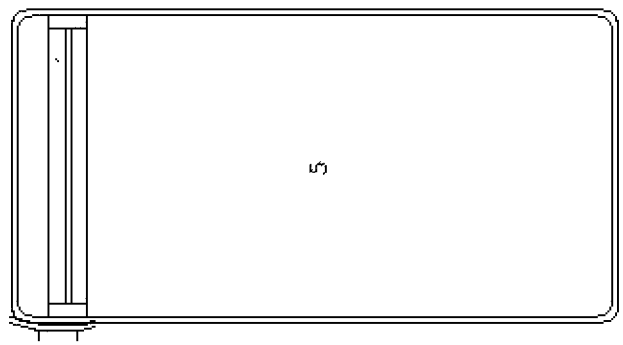

DEVICE AND METHOD FOR NEUTRALIZING THE TRANSMISSION OF ELECTROMAGNETIC WAVES BY SHIELDING, BY MEANS OF A CONTAINER FOR THE HOLDING OF ELECTRICAL OR ELECTRONIC DEVICES WHICH ELECTROMAGNETICALLY PROTECTS THE SAME AND RENDERS THEM ELECTROMAGNETICALLY UNDETECTABLE

The invention relates to a Sector of the Art to which the invention belongs.

1. This invention belongs to the technical sector of electromagnetic communication and more specifically to the H04K 3/00 Perturbation of the communications; Countermeasures [2006.01] according to The Version of The international patent classification (—2019. 01—) whose purpose is to guarantee the confidence and privacy of the user in the use of electromagnetic telecommunication waves, by using a container type that surrounds any type of telecommunication device or apparatus, with the virtuality that its introduction into said container prevents the detection of such apparatus by electromagnetic waves and thereby the possibility of locating said apparatus by means of electromagnetic teledetection, including mobile telephone, radio frequency, or telecommunications via satellite, such As GPS, Galileo, or other systems, without the need to turn off said apparatus previously.

2. In turn, this invention participates in another sector of the art, as is the sector of the nanomaterials known as "metamaterials" and more specifically that of the "electromagnetic meters", since in this invention it provides as A fundamental component A material whose physical structure is smaller than the wavelength of the electromagnetic radiation using the mobiles (which frequency is between 1 gigahertz and 300 gigahertz), so that and as is readily known to arranging the units of the physical structure of said material of a dimension less than half of the wavelength of the electromagnetic spectrum of the visible light (which wavelength is less than one micrometer or which is the same, by providing its physical structure of a dimension less than the half of 560 nanometers the physical structure of this nano material allows for the passage of visible light (which region of the visible electromagnetic spectrum ranges from 380 nanometers to 750 nanometers), since the diameter of the graphene pores are 1.8 nanometers, by which they permit the passage of visible light, but do not allow the passage of the microwaves from the mobile phones, the greater wavelength—for frequencies of 300 gigahertz—is 1 mm.

The invention also relates to the invention based on this type of electromagnetic metamaterials, which is therefore related to the sector of the Technology of the microstructures (B81 Subclass) and at the same time with the nanotechnology sector (B82 sub class) since it relates to nanostructures, whose nanoscale nature provides said physical properties exceptional, entering the sector of the Nanotechnology of materials or surface science, thereby being attributed to the subarea B82K 30/00, and in turn to The subarea B82Y Relative to nanostructures specific uses or applications; measurement or analysis of nanostructures and fabrication or treatment of nanostructures "—, the area being further dusty in the subarea B82B relative to" nanostructures formed by manipulation of individual atoms or molecules"or manufacturing or treatment", although the state of the art in this material relating to the application of the graphene could also be related to other subsectors of the art as:

The preparation of the graphite, including the modified graphite: CO1B 31/04, (CO1B003104)

It should in turn be noted that, since this invention can be developed not only with the graphene but also with another type of A mono element electromagnetic material such as the borofene, in both cases the sector of The art to which it must be doped is that of the nanotechnology for materials or science of surfaces of sector B82 (either In sub Sectors B82K or B82B, or B82Y whereby the borofene in the worst case can always be included in another more residual sector such as the B99, of "Unforeseen materials elsewhere in this section." finally it should be pointed out that the present invention in turn allows the possibility to construct such a container with another type of transparent materials such as crystals, glasses, or plastics/polymers which can be manufactured with the corresponding involvement of metallic nanowires inside the ratio that permits the total electrical shielding, so that it can continue to meet such a requirement for its electromagnetic inadequacy without losing its optical transparency.

For this reason the present invention may further encompass the following sectors:

B29: Working of plastic materials; Working of substances in a plastic state in general B32: Layered products B33: Additive manufacturing technology (2005.01)

The invention relates to a state of the art:

The present invention, based on the creation of this type of containers constructed from these new transparent electromagnetic metamers, constitutes an innovation in the current state of the art, both in the concrete sector of the "perturbation of The communications; countermeasures", (—H04K 3/00 Of the CIP—), as in the sector of the microstructure Technology (B81 subclass) and at the same time with the nanotechnology sector (B82 subclass), and more specifically both in the subsector Of the nanotechnology of materials or surface science, (subarea B82K 30/00), as in the Subsector B82Y relative to nanostructures specific uses or applications; measurement or analysis of nanostructures and fabrication or treatment of nanostructures "—, and even in the Subsector B82B relative to" nanostructures formed by manipulation of individual atoms or molecules, or manufacture or treatment."

The invention relates to an explanation of the invention:

This invention is based on nanomaterials known as "electromagnetic materials" by providing as a fundamental component a material whose physical structure is smaller than the wavelength of electromagnetic radiation using the mobiles (which frequency is typically comprised between 1 gigahertz and 300 gigahertz—), while the units of the physical structure of said material, arranged in a dimension less than the wavelength of the visible light spectrum (whose wavelength is less than a micrometer, or which is the same—560 nanometers—) whereby said material is in turn transparent, so that, in order to permit the passage of sunlight with some fluidity—, the units of their physical structure should not exceed half or less of their wavelength, so that the physical structure of these units it should not exceed 280 nanometers.

Therefore the inventive (or inventive activity) property of this new type of container is the creation of a "transparent" Faraday cage since, in addition to acting said container as an electrically conductive coating which prevents passage into electromagnetic waves, (thus avoiding any type of "electronic noise" therein), it is further transparent, thus constituting the first "Faraday cage" transparent in history, in order to have these new metamaterials of an atomic structure that does not allow for the passage of the electromagnetic waves but it allows the light to pass from the visible spectrum, the electromagnetic radiation having a wavelength of 1015 (namely: from 380 nm to 750 nm) by providing a wavelength of 400 to 790 terahertz.

The invention is characterised in that it is novel with respect to the state of the current art since the invention is characterised in that this invention is the European patent EP 2928100 consisting of a new device and method for neutralizing the impact of an interference signal on a satellite (transposition of Spanish patent ES 2699736 T3) consisting essentially of:

a device and method for acting against intentional and unintended interference from the ground so that the satellite level service can be restored while maintaining the use without modifications of standard user ground receiving stations. Therefore, the solution is not limited to intentional interference and can be applied to any interference that is seen as significant noise on the signal.

The technical problem to be solved is the risk in which it is currently life threatening confidentiality and privacy of mobile telephone users, when communications are intercepted by third parties by computer or electromagnetic systems.

The aim of this invention is to guarantee the confidence and privacy of the user by means of a device and at the same time the method which neutralizes the impact of electromagnetic waves by shielding through a carrier container of telecommunication apparatus which renders the latter undetectable.

This invention consists of a container comprised of one or several parts constructed of a transparent electromagnetic material, which sealing or sealing of its various parts which causes the communication of the telecommunications apparatus introduced therein, by preventing the passage of the electromagnetic waves used by said devices, both through the elements comprising said container, and through the contact or closing area of their respective parts.

Therefore the object claimed by the present invention is new, and therefore the problem that the present invention proposes to solve, can be regarded as a new device and method, which solution involves an inventive activity, according to the art. 33 (3) Of the PCT, because such a solution is not understood in the current state Of the art, nor is it inferred therefrom in an obvious manner, at least to the present priority date.

One of the new "transparent materials" with which this invention can be constructed is graphene, which simply consisting of a monolayer two dimensional arrangement of carbon atoms of a thickness atom, which allows the interior of said interference container or electromagnetic waves to be shielded since the specific two dimensional arrangement of its carbon atoms provides the surface of a waveguide or wave shield of different frequencies with a high electrical conductivity on its surface, said graphene being able to be much more stable by applying its nanoparticles in surface form on common polymers, type PET, as a way to carry out the execution of the present invention. It is finally noted that, unlike the aluminum oxynitride, (which is constructed by a "nanostructuring" process of metal nanoparticles or "nanowires") in front of this, these new electromagnetic materials such as graphene or borofene are differentiated from said aluminum oxynitride in that the physical structure of these is comprised of a monolayer, multi atom arrangement of atoms, of a width of an atom so that while they share properties with the aluminum oxynitride as can be its superconductivity, or even the fact of being transparent, however, these new materials are differentiated from said aluminum oxynitride in that both the graphene and borofene do not allow the passage of the electromagnetic waves used by such telecommunications devices, by which the invention also relates to the physical structure of these new materials, thereby preventing the passage of said waves.

BRIEF DESCRIPTION OF THE CONTENT OF THE DRAWINGS

FIG. 1.1 is a front view of the container device, closed, in a vertical (elevation) position;

FIG. 1.2 is a side view of the container device, closed, in a vertical (elevation) position;

FIG. 1.3 is a front view of the container device, open, in a vertical (elevation) position;

FIG. 1.4 is a side view of the container device, open, in a vertical (elevation) position;

FIG. 1.5 is a top view of the container device, closed, in a vertical (elevation) position;

FIG. 1.6 is a side view of the container device, closed, in a horizontal position;

FIG. 1.7 is a top view of the container device, semi open, in a vertical (elevation) position;

FIG. 1.8 is a side view of the container device, semi open, in a horizontal position;

FIG. 2.1 is a cut of one of the walls forming the container, indicative of the three sheets of different transparent materials that make up said wall;

FIG. 2.2 illustrates a decomposition of the three sheets forming each wall of said sheet container A: outer transparent polymer; sheet Sheet B: graphene; and sheet C: transparent inner polymer;

FIG. 3.1 is a front view of the two housings which form the alternative container to the mono body container of FIG. 1.1;

FIG. 3.2 is a side view of the two housings which form the alternative container to said mono body container;

FIG. 3.3 is a vertical section of the joint of the two housings in its horizontal position;

FIG. 4.1 is a closure system for self nesting plastic longitudinal sheets "zip" in a closed mode, in front and side (elevation) positions;

FIG. 4.2 is a closure system for self nesting plastic longitudinal sheets "zip" in the open mode, in front and lateral (elevation positions;

FIG. 4.3 is similar to FIG. 4.1; and

FIG. 4.4 is an open view of FIG. 4.2.

The invention relates to a numbering for the technical elements of the invention:

1. The invention relates to a rectangular, rectangular prism body at the angles thereof, which forms the mono body container for receiving the mobile.

2. The invention is characterised in that it is located at the top of said rectangular prism body.

3. The invention relates to an area for sealing the tongue with the mono body—or container—to which it is attached.

4. The outer Edge is magnetized from each carcass for magnetic bonding with the other housing.

5. The invention relates to a Housing for connecting the alternative container to the mono body container.

6. The invention relates to an internal Area for the housing of the mobile between both magnetic connection housings.

7. The invention relates to a closure through the system of "zip" type self nestable plastic longitudinal sheets.

8. sheet A: transparent outer polymer.

9. sheet B: graphene.

10. Sheet C: transparent inner polymer.

DETAILED DESCRIPTION OF THE INVENTION

In order to carry out the execution of the present invention it should be pointed out that, upon the simple construction of a container device that need not incorporate in its interior any type of complex mechanism, (since it is intended to construct a "Drug cage" transparent), it is sufficient to indicate that, for its execution, it will suffice to achieve the main structure of the invention, (which is not another that the single sheet or sheet sheet of carbon atoms intended to wrap the said telephone device) are sufficiently joined together by physical contact between the different cutting zones of each sheet, in order to coat said sheets by injecting transparent polymers on them, on both sides, with the particularity that, when it is a very thin sheet, a high precision is required, (in both the steps of covering the upper and lower faces of said sheets with such a polymer, as in the joining operations of the cutting zones of each lamina), so that the tight sealing between such sheets is guaranteed to ensure the inadequacy of the electromagnetic waves across the walls of said carrying container, for the achievement of which will be convenient to assist with equipment of sufficient accuracy at the time of their attachment.

The invention relates to an indication of the way that the invention is susceptible to industrial application.

Finally, it is intended that this invention, in addition to the requirement of the novelty and of its inventive activity, also has the third requirement for its patentability, as is that of its industrial application since this invention, upon the use of the simple construction of a container device, can be carried out according to the techniques that already exist in the polymer injection industry the problem of the acquisition of "monolayer sheets of carbon atoms", such as graphene, etc. is also solved. Since its sale is already widespread in the market for the manufacture of these materials, it can be concluded that it will suffice to cover said "monolayer sheets of atoms" by said transparent polymer injection operations on both sides of each sheet, with the prevention of when a thin layer of this type of material is treated, at the time of the joining of the cutting ends of said sheets, the use of high precision visual devices is required in order to ensure the inadequacy of the electromagnetic waves through the walls of said container.

What is claimed is:

1. A device for neutralizing the impact of electromagnetic waves by shielding through a carrier container of telecommunication apparatus which renders the latter undetectable, comprising: a container comprising one or more parts constructed with a transparent electromagnetic material of graphene or borofene, which sealing of the one or more parts, causes the communication of the telecommunications apparatus introduced therein by preventing the passage of the electromagnetic waves used by said devices, both through the elements comprising said container, and through the contact or closing area of their respective parts, wherein the graphene or borofene comprises a monolayer of carbon atoms structured at the molecular level.

2. The device according to claim 1, wherein said container allows the user to display the entire screen of the telecommunications apparatus.

\* \* \* \* \*